United States Patent
Hong et al.

(10) Patent No.: US 10,622,049 B1
(45) Date of Patent: Apr. 14, 2020

(54) ELECTRONIC DEVICE INCLUDING A SEMICONDUCTOR MEMORY THAT INCLUDES A CIRCUIT FOR CHANGING A WAVEFORM OF A WRITE PULSE

(71) Applicant: SK hynix Inc., Icheon (KR)

(72) Inventors: Seok-Man Hong, Seoul (KR); Tae-Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/964,807

(22) Filed: Apr. 27, 2018

Related U.S. Application Data

(60) Provisional application No. 62/492,014, filed on Apr. 28, 2017.

(51) Int. Cl.
| | | |
|---|---|---|
| *G11C 11/12* | (2006.01) | |
| *G11C 11/16* | (2006.01) | |
| *G11C 11/22* | (2006.01) | |
| *G11C 7/12*  | (2006.01) | |
| *G11C 13/00* | (2006.01) | |

(52) U.S. Cl.
CPC ............ *G11C 11/1675* (2013.01); *G11C 7/12* (2013.01); *G11C 11/2275* (2013.01); *G11C 13/0069* (2013.01); *G11C 2013/0092* (2013.01)

(58) Field of Classification Search
None
See application file for complete search history.

(56) References Cited

U.S. PATENT DOCUMENTS

| | | | |
|---|---|---|---|
| 6,487,113 B1* | 11/2002 | Park | G11C 13/0004 365/148 |
| 6,625,054 B2* | 9/2003 | Lowrey | G11C 11/56 365/148 |
| 8,456,933 B2* | 6/2013 | An | G11C 8/08 365/148 |
| 2006/0215440 A1* | 9/2006 | Cho | G11C 11/5678 365/148 |
| 2010/0110803 A1* | 5/2010 | Arai | G11C 7/1006 365/189.05 |
| 2015/0243355 A1* | 8/2015 | Lee | G11C 13/0069 365/148 |

FOREIGN PATENT DOCUMENTS

| | | |
|---|---|---|
| KR | 10-2010-0022788 A | 3/2010 |
| KR | 10-2011-0025331 A | 3/2011 |

* cited by examiner

*Primary Examiner* — Douglas King

(57) ABSTRACT

An electronic device includes a semiconductor memory. The semiconductor memory includes: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes.

19 Claims, 8 Drawing Sheets

ELECTRONIC DEVICE INCLUDING A SEMICONDUCTOR MEMORY THAT INCLUDES A CIRCUIT FOR CHANGING A WAVEFORM OF A WRITE PULSE

CROSS-REFERENCE TO RELATED APPLICATIONS

The present application claims priority to U.S. Provisional Patent Application No. 62/492,014, entitled "ELECTRONIC DEVICE" and filed on Apr. 28, 2017, which is incorporated by reference herein in its entirety.

TECHNICAL FIELD

This patent document relates to memory circuits, memory devices, and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers, portable communication devices, and so on, have been demanded in the art, and research for the development of such semiconductor devices has been conducted. Such semiconductor devices include semiconductor devices which can store data by switching between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits and memory devices, as well as their applications in electronic devices and systems. The disclosed technology also includes various implementations of an electronic device. The electronic device may perform a write operation on memory cells according to an optimum condition.

In an implementation, there is provided an electronic device including a semiconductor memory. The semiconductor memory may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes.

A slope of a first part of the changed falling edge may be steeper than a slope of a second part of the changed falling edge. The changed falling edge may have a shape of an exponential function. The selected memory cell may be a resistance state corresponding to the write data, the resistance state being based on the write pulse having the changed falling edge in the write mode, and wherein the write pulse may correspond to a set pulse having a square wave shape, the set pulse changing a resistance state of the selected memory cell into a low resistance state. The write pulse conversion circuit may include: a control block configured to generate a conversion control signal based on the write data; and a conversion block configured to change the falling edge of the write pulse based on the conversion control signal. The selected memory cells may have a resistance state corresponding to the write data based on the write pulse having the changed falling edge in the write mode, and wherein the control block may enable the conversion control signal based on the write data corresponding to a low resistance state during a period corresponding to the falling edge of the write pulse.

In an implementation, there is provided an electronic device including a semiconductor memory. The semiconductor memory may include: a first global line; a second global line; a plurality of first local lines; a plurality of second local lines; a plurality of memory cells disposed in respective intersection regions between the plurality of first local lines and the plurality of second local lines and coupled between the plurality of first local lines and the plurality of second local lines; a write circuit configured to generate a write pulse corresponding to write data in a write mode; a first global switch circuit configured to transmit the write pulse to the first global line in response to a first global selection signal; a first local switch circuit configured to transmit, as a first write pulse, the write pulse transmitted to the first global line to a first local line selected from the plurality of first local lines based on a plurality of first local selection signals; a second local switch circuit configured to transmit a second write pulse to the second global line based on a plurality of second local selection signals, the second write pulse corresponding to the first write pulse that is transmitted through the selected first local line, a memory cell selected from the plurality of memory cells, and a second local line selected from the plurality of second local lines; a second global switch circuit configured to transmit the second write pulse transmitted to the second global line to a low voltage terminal in response to a second global selection signal; and a write pulse conversion circuit coupled to the first global line and configured to change a waveform of the write pulse transmitted to the first global line based on the first global selection signal and the write data.

A falling edge among the waveform of the write pulse transmitted to the first global line may be changed to have two or more slopes. A slope of a first part of the changed falling edge may be steeper than a slope of a second part of the changed falling edge. The changed falling edge may have an exponential function shape. The selected memory cell may have a resistance state corresponding to the write data, which is determined by the write pulse having the changed falling edge in the write mode, and wherein the write pulse may correspond to a set pulse having a square wave shape, the set pulse changing the selected memory cell into a low resistance state. The write pulse conversion circuit may include: a control block configured to generate a conversion control signal by performing a logic operation on the first global selection signal based on a set control signal corresponding to a first data value of the write data; and a conversion block configured to change the falling edge of the write pulse based on the conversion control signal. A resistance state of each of the plurality of memory cells may be changed into one of a low resistance state corresponding to the first data value and a high resistance state corresponding to a second data value based on the first write pulse, and wherein the control block may enable the conversion control signal during a period corresponding to a falling edge among the waveform of the write pulse when the set control signal corresponding to the low resistance state is enabled. The control block may include: a transmission unit configured to transmit the first global selection signal in response to the set control signal; a delay line configured to delay the first global selection signal, which has been transmitted through the transmission unit, by a predetermined delay time; and an AND gate configured to generate the conversion control signal by performing an AND operation on the first global selection signal and the delayed first global selection signal. The conversion block may include: a capacitor including a first end that is coupled to a low voltage terminal; and a coupling unit configured to selectively couple a second end of the capacitor to the first global line in response to the conversion control signal.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

DETAILED DESCRIPTION

Figure 1:
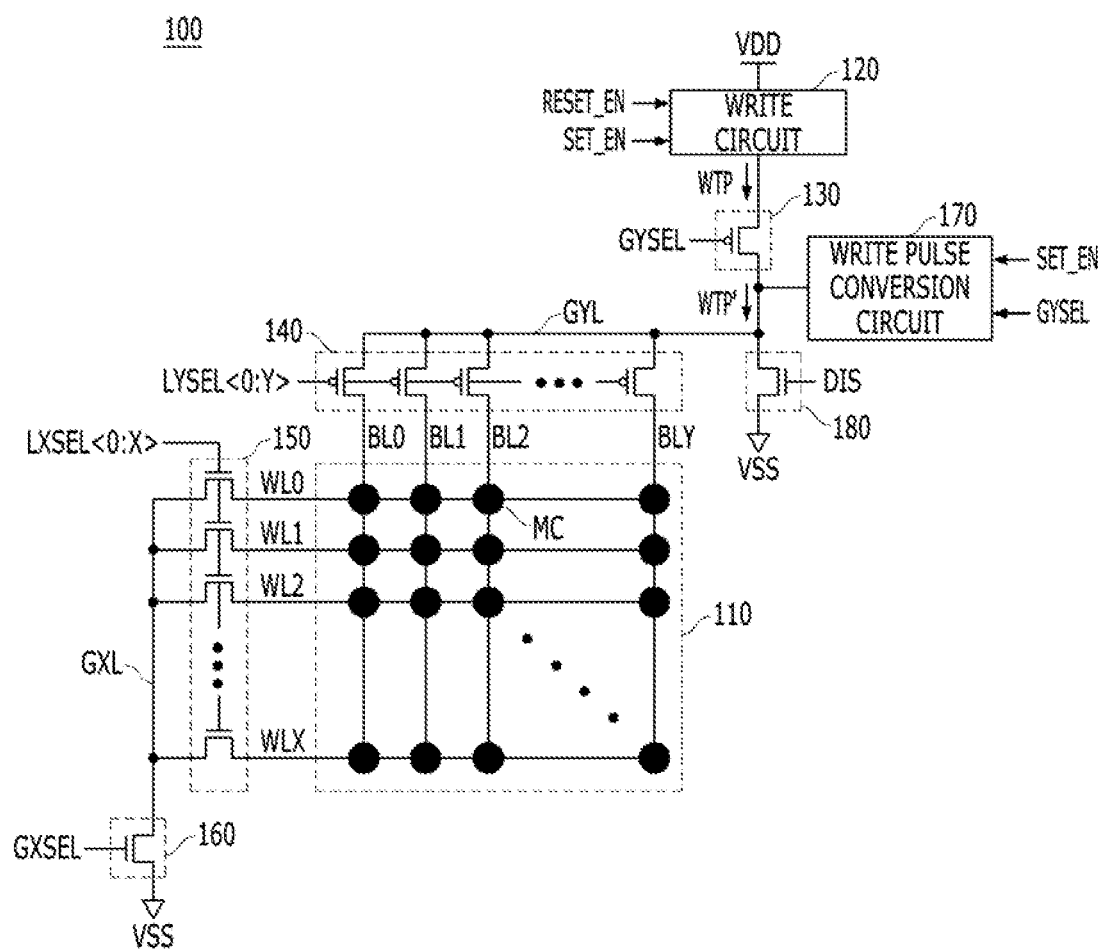
FIG. 1 is a configuration diagram illustrating a memory device in accordance with an implementation of the present disclosure.

Various examples and implementations of the disclosed technology are described below in detail with reference to the accompanying drawings.

The present disclosure may, however, be embodied in different forms and should not be construed as limited to the implementations set forth herein. Rather, these implementations are provided so that this disclosure will be thorough and complete, and will fully convey the scope of the present disclosure to those skilled in the art. Throughout the disclosure, like reference numerals refer to like parts throughout the various figures and implementations of the present disclosure.

A semiconductor memory device in accordance with implementations of the disclosed technology may include a variable resistance element that exhibits a variable resistance characteristic, i.e., a variable resistance element that represents different digital bits or states by exhibiting different resistance values. In implementations, the variable resistance element may include a single-layer or a multi-layer structure exhibiting the variable resistance characteristic, and may include any of a material used in a RRAM, PRAM, STTRAM, MRAM, or FRAM (e.g., a ferromagnetic material), a ferroelectric material, a phase change material (e.g., a chalcogenide material), and a metal oxide (e.g., a perovskite material or a transition metal oxide).

The variable resistance element may include a transition metal oxide, a perovskite material, or both. The transition metal oxide may include nickel (Ni) oxide, titanium oxide (TiO), hafnium oxide (HfO), zirconium oxide (ZrO), tungsten oxide (WO), cobalt oxide (CoO), or a combination thereof. The perovskite material includes strontium titanium oxide (STO: SrTiO), praseodymium calcium manganese oxide (PCMO: PrCaMnO), or both.

Moreover, the variable resistance element may include a phase change material. The phase change material may include a chalcogenide material, such as germanium-antimony-tellurium (GST: GeSbTe). The variable resistance element switches between different resistance states by changing its structure into a crystal state or an amorphous state according to applied heat.

The variable resistance element may include two magnetic layers and a tunnel barrier layer interposed between the two magnetic layers. The magnetic layer may include any of nickel-iron-cobalt (NiFeCo), cobalt-iron (CoFe), etc. The tunnel barrier layer may include aluminum oxide ($Al_2O_3$). The variable resistance element may switch between two different resistance states according to magnetization directions of the two magnetic layers. For example, the variable resistance element may be in a low resistance state when the magnetization directions of the two magnetic layers are parallel, and be in a high resistance state when the magnetization directions of the two magnetic layers are anti-parallel.

FIG. 1 is a configuration diagram illustrating a memory device 100 in accordance with an implementation of the present disclosure.

Referring to FIG. 1, the memory device 100 may include a global bit line GYL, $0^{th}$ to $Y^{th}$ local bit lines BL0 to BLY, $0^{th}$ to $X^{th}$ local word lines WL0 to WLX, a global word line GXL, a memory cell array 110, a write circuit 120, a first global switch circuit 130, a first local switch circuit 140, a second local switch circuit 150, a second global switch circuit 160, a write pulse conversion circuit 170, and a discharge block 180.

The memory cell array 110 may include a plurality of memory cells MC arranged in a cross-point array structure. That is, the plurality of memory cells MC may be disposed in respective intersection regions between the $0^{th}$ to $Y^{th}$ local bit lines BL0 to BLY and the $0^{th}$ to $X^{th}$ local word lines WL0 to WLX and coupled between the $0^{th}$ to $Y^{th}$ local bit lines BL0 to BLY and the $0^{th}$ to $X^{th}$ local word lines WL0 to WLX. Among the plurality of memory cells MC, memory cells arranged in the same column line may share the same local bit line, and memory cells arranged in the same row line may share the same local word line. A memory cell MC # selected from the plurality of memory cells MC may be coupled to a local bit line BL # selected from the $0^{th}$ to $Y^{th}$ local bit lines BL0 to BLY and to a local word line WL # selected from the $0^{th}$ to $X^{th}$ local word lines WL0 to WLX.

Although not illustrated, each of the memory cells MC may include a variable resistance element and a selection element. The variable resistance element may have a high resistance state or a low resistance state depending on a logical value (i.e., a data value) of data stored in the memory cell MC. The high resistance state may be referred to as a 'RESET' state. The low resistance state may be referred to as a 'SET' state. For example, the variable resistance element may include a phase change material. In this case, the variable resistance element may have the high resistance state when the variable resistance element is in an amorphous state, or the low resistance state when the variable resistance element is in a crystalline state. To be specific, the variable resistance element may have the low resistance state corresponding to the crystalline state when the variable resistance element has been steadily cooled down after being melted by a set pulse having a slow quenching pattern. The variable resistance may have the high resistance state corresponding to the amorphous state when the variable resistance element has been rapidly cooled down after being melted by a reset pulse having a fast quenching pattern. The selection element may be turned on or off due to a voltage difference between both ends thereof. For example, the selection element may include any of a diode, a Schottky diode, an OTS (Ovonic Threshold Switch), an MIT (Metal Insulator Transistor), an MIET (Mixed Ion-Electron Conducting) device, etc.

The write circuit 120 may generate a write pulse WTP corresponding to write data to be written in the memory cell MC # in a write mode. For example, the write circuit 120 may generate a write pulse WTP corresponding to a set pulse based on a set control signal SET_EN, and may generate a write pulse WTP corresponding to a reset pulse based on a reset control signal RESET_EN. The set control signal SET_EN corresponds to a first data value of the write data, and the reset control signal RESET_EN corresponds to a second data value of the write data. The write pulse WTP may include a write current.

The first global switch circuit 130 may transmit the write pulse WTP to the global bit line GYL in response to a first global selection signal GYSEL. For example, the first global switch circuit 130 may include a PMOS transistor having a gate receiving the first global selection signal GYSEL, and may be coupled between the write circuit 120 and the global bit line GYL. The write pulse WTP, which has been transmitted to the global bit line GYL, is referred to as a write pulse WTP'.

The first local switch circuit 140 may be coupled between the global bit line GYL and the memory cell array 110, and may transmit the write pulse WTP' at the global bit line GYL to the selected local bit line BL # in response to $0^{th}$ to $Y^{th}$ local selection signals LYSEL<0:Y>. The first local switch circuit 140 may include $0^{th}$ to $Y^{th}$ switch elements coupled between the global bit line GYL and the $0^{th}$ to $Y^{th}$ local bit lines BL0 to BLY. For example, the $0^{th}$ switch element may include a PMOS transistor, which has a gate receiving the $0^{th}$ local selection signal LYSEL<0> and is coupled between the global bit line GYL and the $0^{th}$ local bit line BL0.

The second local switch circuit 150 may transmit the write pulse WTP', which has been transmitted through the selected local bit line BL #, the selected memory cell MC #, and the selected local word line WL #, to the global word line GXL in response to $0^{th}$ to $X^{th}$ local selection signals LXSEL<0:X>. For example, the second local switch circuit 150 may include $0^{th}$ to $X^{th}$ switch elements coupled between the global word line GXL and the $0^{th}$ to $X^{th}$ local word lines WL0 to WLX. For example, the $0^{th}$ switch element may include an NMOS transistor, which has a gate receiving the $0^{th}$ local selection signal LXSEL<0> and is coupled between the global word line GXL and the $0^{th}$ local word line WL0.

The second global switch circuit 160 may transmit the write pulse WTP', which has been transmitted to the global word line GXL, to a low voltage terminal VSS in response to a second global selection signal GXSEL. For example, the second global switch circuit 160 may include an NMOS transistor, which has a gate receiving the second global selection signal GXSEL and is coupled between the low voltage terminal VSS and the global word line GXL.

The write pulse conversion circuit 170 may be coupled to the global bit line GYL, and may change a waveform of the write pulse WTP' based on the first global selection signal GYSEL and the set control signal SET_EN. For example, the write pulse conversion circuit 170 may change a falling edge of the write pulse WTP' to have two or more slopes. A slope of a front part of the falling edge may be steeper than a slope of a back part of the falling edge. For example, the falling edge may have a shape of an exponential function, i.e., the falling edge may decline exponentially.

The discharge block 180 may discharge a current or a charge remaining in the global bit line GYL in response to a discharge control signal DIS. The discharge control signal DIS may be enabled at a moment when the write mode terminates.

Figure 2A:
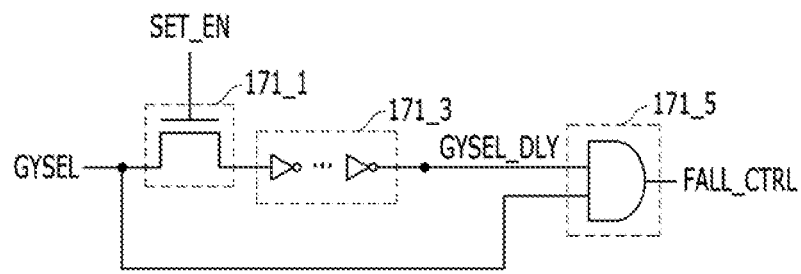
FIGS. 2A and 2B are circuit diagrams illustrating an example of a write pulse conversion circuit shown in FIG. 1 in accordance with an implementation of the present disclosure.
Figure 2B:
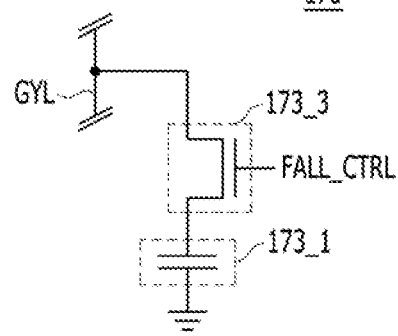

FIGS. 2A and 2B are circuit diagrams illustrating the write pulse conversion circuit 170 shown in FIG. 1 in accordance with an implementation of the present disclosure.

Referring to FIGS. 2A and 2B, the write pulse conversion circuit 170 may include a control block 171 and a conversion block 173.

Referring to FIG. 2A, the control block 171 of the write pulse conversion circuit 170 may generate a conversion control signal FALL_CTRL that is enabled during a period corresponding to the falling edge of the write pulse WTP', based on the set control signal SET_EN and the first global selection signal GYSEL. For example, the control block 171 may include a transmission unit 171_1, a delay unit 171_3, and a logic operation unit 171_5.

The transmission unit 171_1 may selectively transmit the first global selection signal GYSEL in response to the set control signal SET_EN. For example, the transmission unit 171_1 may include a switch. Referring to FIG. 2A, the transmission unit 171_1 includes an NMOS transistor, which has a gate receiving the set control signal SET_EN and is coupled between an input terminal receiving the first global selection signal GYSEL and one end of the delay unit 171_3.

The delay unit 171_3 may delay the first global selection signal GYSEL transmitted through the transmission unit 171_1 by a predetermined delay time and generate a delay signal GYSEL_DLY. For example, the delay unit 171_3 may include a delay line. The delay line may include a plurality of inverters connected in series.

The logic operation unit 171_5 may perform a logic operation on the first global selection signal GYSEL and the delay signal GYSEL_DLY and generate the conversion control signal FALL_CTRL. For example, the logic operation unit 171_5 may include an AND gate for performing an AND operation on the first global selection signal GYSEL and the delay signal GYSEL_DLY.

Referring to FIG. 2B, the conversion block 173 of the write pulse conversion circuit 170 may change slopes of the falling edge of the write pulse WTP' in response to the conversion control signal FALL_CTRL from the control block 171 of FIG. 2A. For example, the conversion block 173 may include a charge unit 173_1 and a coupling unit 173_3. The charge unit 173_1 may be coupled between the low voltage terminal VSS and one end of the coupling unit 173_3. For example, the charge unit 173_1 may include a capacitor. The coupling unit 173_3 may selectively couple the global bit line GYL and the other end of the charge unit 173_1 in response to the conversion control signal FALL_CTRL. The coupling unit 173_3 may include a switch. Referring to FIG. 2B, the coupling unit 173_3 includes an NMOS transistor, which has a gate receiving the conversion control signal FALL_CTRL.

Hereinafter, an operation of the memory device 100 having the aforementioned structure will be described with reference to FIG. 3 and FIGS. 4A and 4B.

Figure 3:
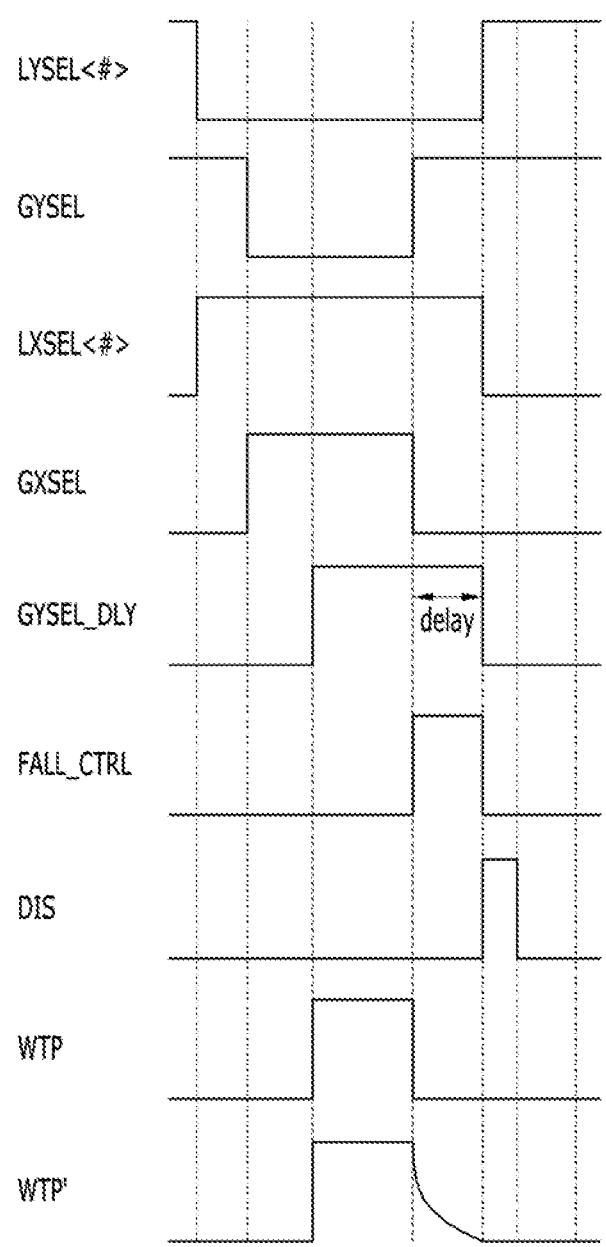
FIG. 3 is a timing diagram illustrating an operation of the memory device shown in FIG. 1 in accordance with an implementation of the present disclosure.

FIG. 3 is a timing diagram illustrating an operation of the memory device 100 shown in FIG. 1 in accordance with an implementation of the present disclosure.

Referring to FIG. 3, a first local selection signal LYSEL<#> selected from the $0^{th}$ to $Y^{th}$ local selection signals LYSEL<0:Y>, a second local selection signal LXSEL<#> selected from the $0^{th}$ to $X^{th}$ local selection signals LXSEL<0:X>, the first global selection signal GYSEL, and the second global selection signal GXSEL may be enabled during respective predetermined write periods. Accordingly, one end of the selected memory cell MC # may be coupled to a high voltage terminal VDD through the selected local bit line BL #, the first local switch circuit 140, the global bit line GYL, the first global switch circuit 130, and the write circuit 120. The other end of the selected memory cell MC # may be coupled to the low voltage terminal VSS through the selected local word line WL #, the second local switch circuit 150, the global word line GXL, and the second global switch circuit 160. Consequently, the selected memory cell MC # may be turned on or off due to a voltage difference between both ends thereof.

The write circuit 120 may generate the write pulse WTP corresponding to a set pulse based on the set control signal SET_EN. For example, the write pulse WTP corresponding to the set pulse may have a smaller amplitude and a greater pulse width than a write pulse corresponding to a reset pulse. The write pulse WTP may be generated in a square wave shape.

The write pulse WTP corresponding to the set pulse may be transmitted to the global bit line GYL through the first global switch circuit 130. The write pulse WTP, which has been transmitted to the global bit line GYL, is referred to as a write pulse WTP'.

The write pulse conversion circuit 170 may change a waveform of the write pulse WTP' transmitted to the global bit line GYL based on the set control signal SET_EN and the first global selection signal GYSEL. For example, the write pulse conversion circuit 170 may change the waveform of the write pulse WTP' so that the falling edge of the write pulse WTP' has the exponential function shape illustrated in FIG. 3. To be specific, referring to FIG. 2A, the transmission unit 171_1 may transmit the first global selection signal GYSEL to the delay unit 171_3 in response to the set control signal SET_EN, and the delay unit 171_3 may delay the first global selection signal GYSEL transmitted through the transmission unit 171_1 by the predetermined delay time and generate the delay signal GYSEL_DLY, and the logic operation unit 171_5 may perform an AND operation on the first global selection signal GYSEL and the delay signal GYSEL_DLY and generate the conversion control signal FALL_CTRL that is enabled during a period corresponding to the falling edge of the write pulse WTP'. The coupling unit 173_3 of FIG. 2B may couple the charge unit 173_1 to the global bit line GYL in response to the conversion control signal FALL_CTRL. Consequently, the falling edge of the write pulse WTP' transmitted through the global bit line GYL may have the exponential function shape. In the implementation of the operation illustrated in FIG. 3, the delay line of the delay unit 171_3 illustrated in FIG. 2A includes an odd number of inverters, however, other implementations are possible.

Figure 4A:
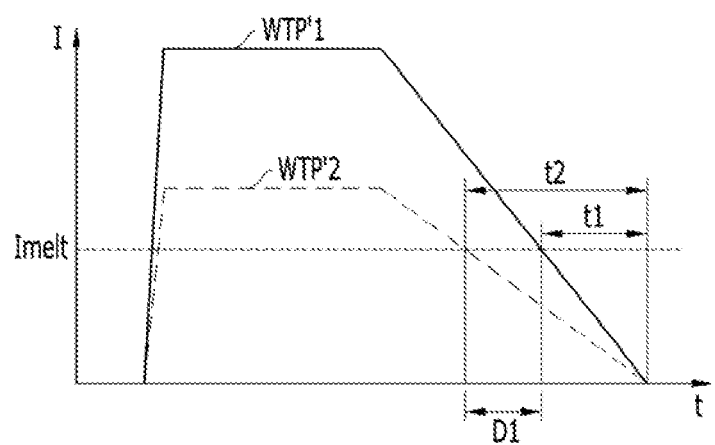
FIGS. 4A and 4B illustrate improved performance of the memory device of FIG. 1.
Figure 4B:
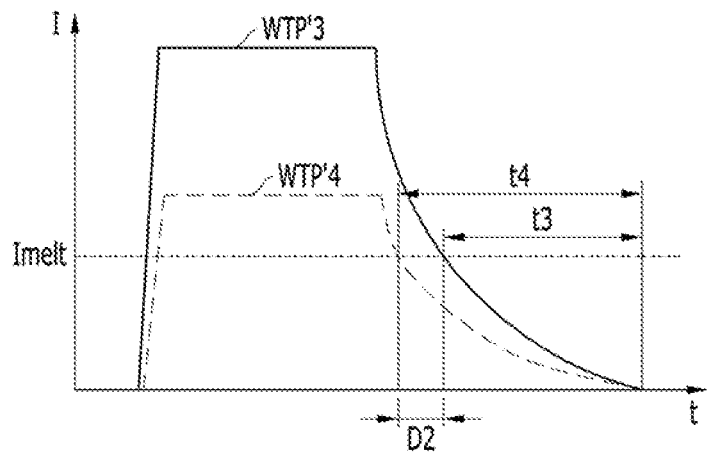

FIGS. 4A and 4B illustrate current curves to show improved performance of the memory device 100 according to the write pulse WTP' shown in FIG. 3. To be specific, FIG.

4A illustrates a write pulse provided to a global bit line according to a conventional art, and FIG. 4B illustrates a write pulse provided to a global bit line according to an implementation of the present disclosure.

First, a first write pulse WTP'1 shown in FIG. 4A will be compared with a third write pulse WTP'3 shown in FIG. 4B. It is assumed that a period corresponding to a falling edge of the first write pulse WTP'1 is the same as a period corresponding to a falling edge of the third write pulse WTP'3.

A sub-period in which a current is below a melting point Imelt in the period corresponding to the falling edge of the first write pulse WTP'1 may correspond to a period "t1" shown in FIG. 4A. A sub-period in which a current is below a melting point Imelt in the period corresponding to the falling edge of the third write pulse WTP'3 may correspond to a period "t3" shown in FIG. 4B. Since the period t3, in which the current is below the melting point Imelt of the third write pulse WTP'3, may be longer than the period t1, in which the current is below the melting point Imelt of the first write pulse WTP'1, a memory cell that is written by the third write pulse WTP'3 may have a lower resistance state or a more stable low resistance state than a memory cell that is written by the first write pulse WTP'1.

Next, the first write pulse WTP'1 shown in FIG. 4A will be compared with a second write pulse WTP'2 shown in FIG. 4A. The first write pulse WTP'1 may have a waveform applied to a memory cell MC, which is relatively close to the write circuit 120, and the second write pulse WTP'2 may have a waveform applied to a memory cell MC, which is relatively far away from the write circuit 120. There may be a first deviation period D1 that is a difference between the period t1 below the melting point Imelt of the first write pulse WTP'1 and a period t2, in which a current is below the melting point Imelt in a period corresponding to a falling edge of the second write pulse WTP'2. The first deviation period D1 represents dispersion of a low resistance state during a write operation, depending on positions of memory cells MC.

Finally, the third write pulse WTP'3 shown in FIG. 4B will be compared with a fourth write pulse WTP'4 shown in FIG. 4B. The third write pulse WTP'3 may have a waveform applied to a memory cell MC, which is relatively close to the write circuit 120, and the fourth write pulse WTP'4 may have a waveform applied to a memory cell MC, which is relatively far away from the write circuit 120. There may be a second deviation period D2 that is a difference between the period t3, in which a current is below the melting point Imelt of the third write pulse WTP'3, and a period t4, in which a current is below the melting point Imelt in a period corresponding to a falling edge of the fourth write pulse WTP'4. The second deviation period D2 represents dispersion of a low resistance state during a write operation, depending on positions of memory cells MC.

The second deviation period D2 is shorter than the first deviation period D1. This means that, according to the implementation of the present disclosure, the dispersion of the low resistance state depending on the positions of the memory cells MC is smaller than that of the conventional art.

According to the implementations of the present disclosure, as a memory cell is written in an optimum condition, a write time may be reduced or the memory cell may have an optimum resistance state. Further, as the memory cell is written in the optimum condition, resistance dispersion of memory cells may be reduced.

Consequently, according to the implementations of the present disclosure, it is possible to improve operational characteristics of a semiconductor memory.

The above and other memory circuits or semiconductor devices based on the disclosed technology may be used in a range of devices or systems. FIGS. 5-9 provide some examples of devices or systems that may implement the memory circuits disclosed herein.

Figure 5:
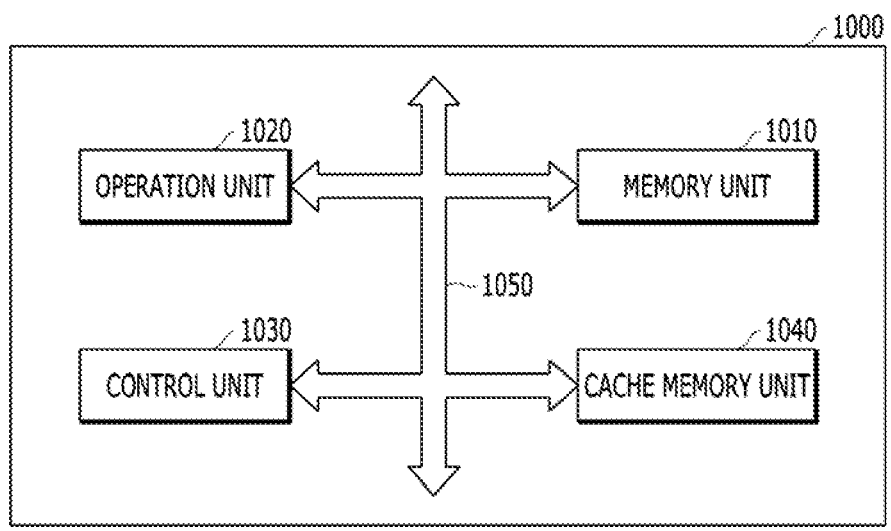
FIG. 5 is an example of a configuration diagram of a microprocessor implementing memory circuitry based on the disclosed technology.

FIG. 5 is an example of a configuration diagram of a microprocessor implementing memory circuitry based on the disclosed technology.

Referring to FIG. 5, a microprocessor 1000 may perform tasks for controlling and tuning a series of processes for receiving data from various external devices, processing the data, and outputting processing results to external devices. The microprocessor 1000 may include a memory unit 1010, an operation unit 1020, a control unit 1030, and so on. The microprocessor 1000 may be any of various data processing units, such as a central processing unit (CPU), a graphic processing unit (GPU), a digital signal processor (DSP), or an application processor (AP).

The memory unit 1010 is a part which stores data in the microprocessor 1000, as a processor register, or the like. The memory unit 1010 may include a data register, an address register, a floating point register, and so on. The memory unit 1010 may include various registers. The memory unit 1010 may perform a function of temporarily storing data for which operations are to be performed by the operation unit 1020, result data of performing the operations and addresses where data for performing the operations are stored.

The memory unit 1010 may include one or more of the above-described semiconductor devices in accordance with the implementations. For example, the memory unit 1010 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the memory unit 1010 may be improved. As a consequence, performance characteristics of the microprocessor 1000 may be improved.

The operation unit 1020 may perform four arithmetical operations or logical operations according to results of the control unit 1030 decoding commands. The operation unit 1020 may include one or more arithmetic logic units (ALUs) and so on.

The control unit 1030 may receive signals from the memory unit 1010, from the operation unit 1020, and from a device external to the microprocessor 1000. The control unit 1030 may further perform extraction, decode commands, control input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or data to be outputted to an external device. In this case, the cache memory unit 1040 may exchange data with the memory unit 1010, the operation unit 1020, and the control unit 1030, through a bus interface 1050.

Figure 6:
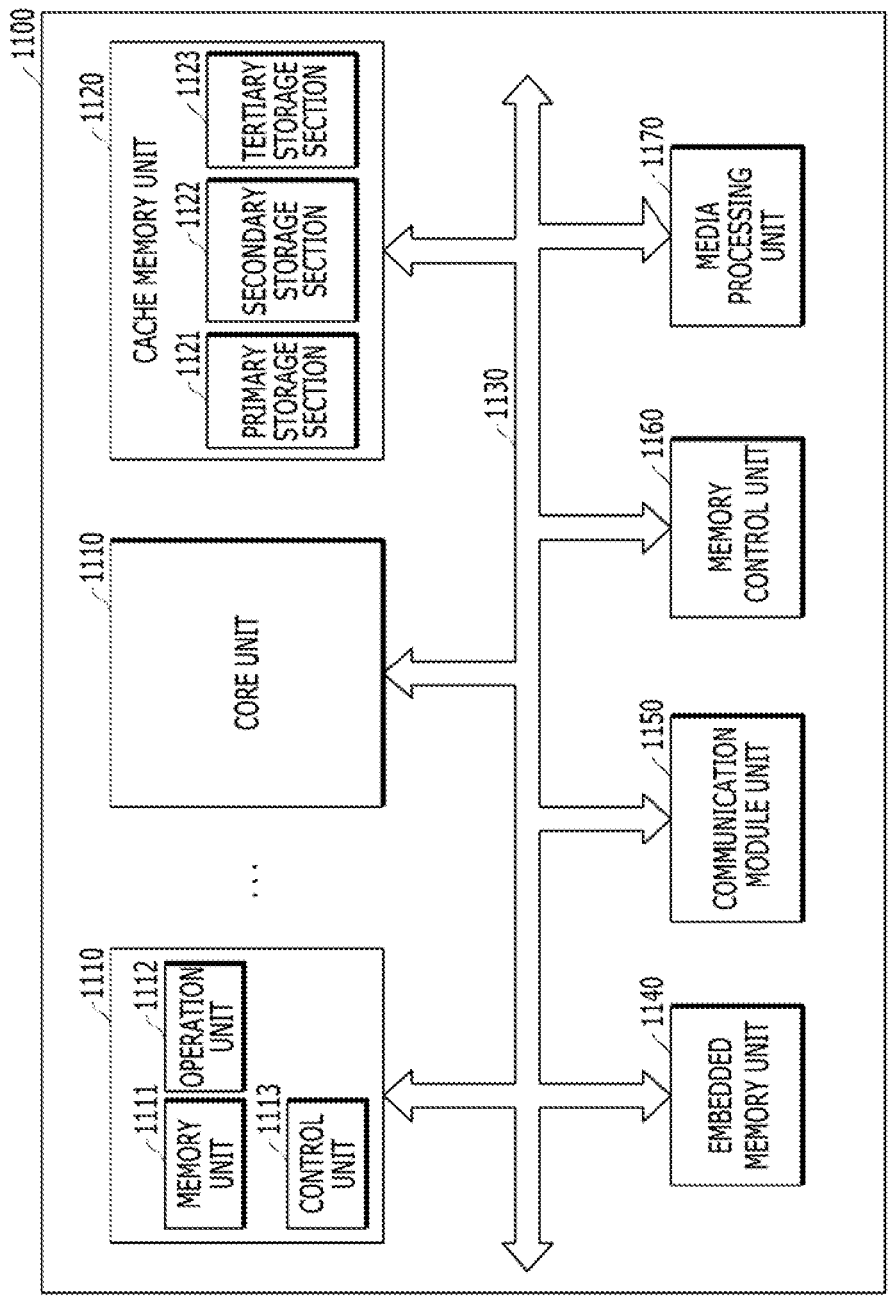
FIG. 6 is an example of a configuration diagram of a processor implementing memory circuitry based on the disclosed technology.

FIG. 6 is an example of a configuration diagram of a processor implementing memory circuitry based on the disclosed technology.

Referring to FIG. 6, a processor 1100 may improve performance and realize multi-functionality by including various functions, other than those of a microprocessor, which performs tasks for controlling and tuning a series of processes of receiving data from various external devices, processing the data, and outputting processing results to external devices. The processor 1100 may include a core unit 1110, which serves as the microprocessor; a cache memory unit 1120, which stores data temporarily; and a bus interface 1130 for transferring data between internal and external devices. The processor 1100 may include any of various system-on-chips (SoCs), such as a multi-core processor, a graphic processing unit (GPU), and an application processor (AP).

The core unit 1110 of the present implementation is a part which performs arithmetic logic operations for data inputted from an external device, and may include a memory unit 1111, an operation unit 1112, and a control unit 1113.

The memory unit 1111 is a part which stores data in the processor 1100, as a processor register, a register, or the like. The memory unit 1111 may include a data register, an address register, a floating point register, and so on. The memory unit 1111 may include various registers. The memory unit 1111 may perform a function of temporarily storing data for which operations are to be performed by the operation unit 1112, result data of performing the operations and addresses where data for performing the operations are stored. The operation unit 1112 is a part which performs operations in the processor 1100. The operation unit 1112 may perform four arithmetical operations, logical operations, or the like according to results of the control unit 1113 decoding commands. The operation unit 1112 may include one or more arithmetic logic units (ALUs) and so on. The control unit 1113 may receive signals from the memory unit 1111, from the operation unit 1112, and from a device external to the processor 1100. The control unit 1113 may further perform extraction, decode commands, control input and output of signals of processor 1100, and execute processing represented by programs.

The cache memory unit 1120 is a part which temporarily stores data to compensate for a difference in data processing speed between the core unit 1110 that operates at a high speed and an external device that operates at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include a greater number of storage sections. That is to say, the number of storage sections which are included in the cache memory unit 1120 may be changed according to a design goal. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be the highest. One or more storage sections of the primary storage section 1121, the secondary storage section 1122, and the tertiary storage section 1123 of the cache memory unit 1120 may include one or more of the above-described semiconductor devices in accordance with the implementations. For example, the cache memory unit 1120 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the cache memory unit 1120 may be improved. As a consequence, performance characteristics of the processor 1100 may be improved.

Although it is shown in FIG. 6 that all the primary, secondary, and tertiary storage sections 1121, 1122, and 1123 are configured inside the cache memory unit 1120, it is to be noted that at least one of the primary, secondary, and tertiary storage sections 1121, 1122, and 1123 may be configured outside the cache memory unit 1120, and may compensate for a difference in data processing speed between the core unit 1110 and the external device. Meanwhile, it is noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for the difference in data processing speed.

In another implementation, the primary and secondary storage sections 1121 and 1122 may be disposed inside the core units 1110, and the tertiary storage sections 1123 may be disposed outside the core unit 1110.

The bus interface 1130 connects the core unit 1110, the cache memory unit 1120, and an external device, and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 may be configured in each of the plurality of core units 1110 in correspondence to the number of the plurality of core units 1110, and the secondary storage section 1122 and the tertiary storage section 1123 may be configured outside the plurality of core units 1110 in such a way as to be shared by the plurality of core units 1110 through the bus interface 1130. The processing speed of the primary storage section 1121 may be higher than the processing speeds of the secondary and tertiary storage sections 1122 and 1123. In another implementation, the primary storage section 1121 and the secondary storage section 1122 may be configured in each of the plurality of core units 1110 in correspondence to the number of the plurality of core units 1110, and the tertiary storage section 1123 may be configured outside the plurality of core units 1110 in such a way as to be shared cache memory unit 1120 through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes data processed in the processor 1100 or data inputted from an external input device and outputs the processed data to an external interface device, and so on. The processor 1100 may also include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include any of a DRAM (dynamic random access memory), a mobile DRAM, an SRAM (static random access memory), a memory with similar functions to the above mentioned memories, and so on. The nonvolatile memory may include any of a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network, or both. The wired network may include a local area network (LAN), a universal serial bus (USB), an Ethernet, power line communication (PLC) components, or the like, such that various devices transmit and receive data through transmission lines. The wireless network may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), etc. The wireless network may include various devices which send and receive data without transmit lines, and so on.

The memory control unit 1160 manages and processes data that are transmitted between the processor 1100 and an external storage device according to different communication standards. The memory control unit 1160 may include any of various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or data inputted in the forms of image, voice and others from the external input device, and may output the processed data to the external interface device. The media processing unit 1170 may include a graphic processing unit (GPU), a digital signal processor (DSP), a high definition audio device (HD audio), a high definition multimedia interface (HDMI) controller, or the like.

Figure 7:
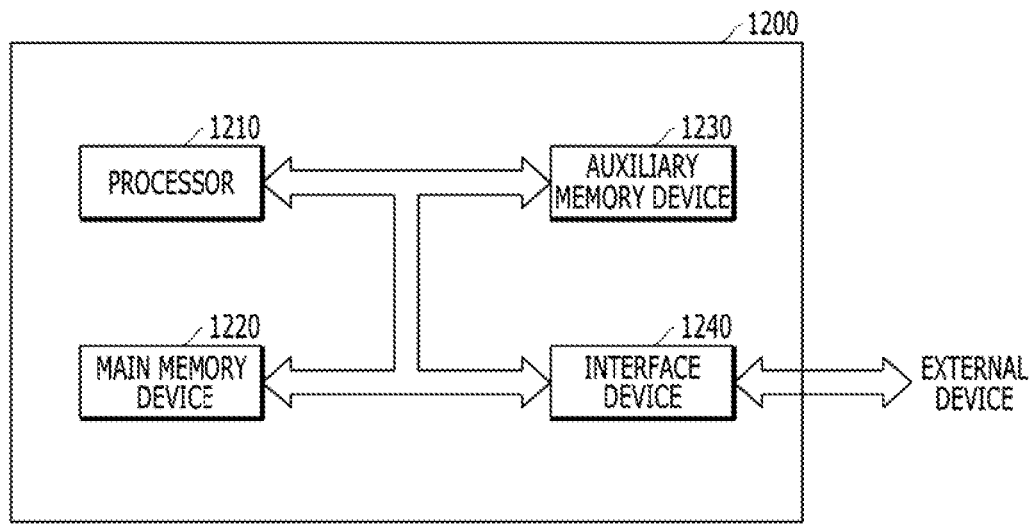
FIG. 7 is an example of a configuration diagram of a system implementing memory circuitry based on the disclosed technology.

FIG. 7 is an example of a configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when a power supply is cut off. The main memory device 1220 may include one or more of the above-described semiconductor devices in accordance with the implementations. For example, the main memory device 1220 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when a power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when a power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may perform an exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network, or both. The wired network module may include a local area network (LAN), a universal serial bus (USB), an Ethernet, power line communication (PLC), such as various devices which send and receive data through transmit lines, and so on. The wireless network module may use and/or include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), etc. The wireless network may include various devices which send and receive data without transmit lines, and so on.

Figure 8:
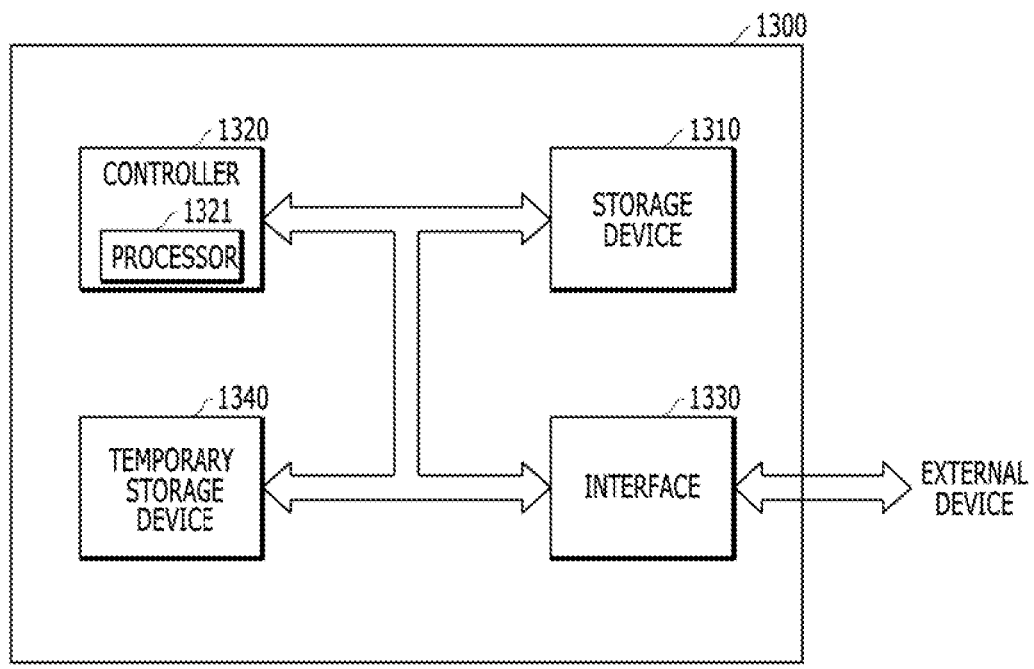
FIG. 8 is an example of a configuration diagram of a data storage system implementing memory circuitry based on the disclosed technology.

FIG. 8 is an example of a configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type, such as a hard disk drive (HDD), a compact disc read only memory (CDROM), a digital versatile disc (DVD), a solid state disk (SSD), and so on; and a card type, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an external device outside of the data storage system 1300 and so on.

The interface 1330 performs an exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the temporary storage device 1340 may be improved. As a consequence, performance characteristics of the system 1300 may be improved.

Figure 9:
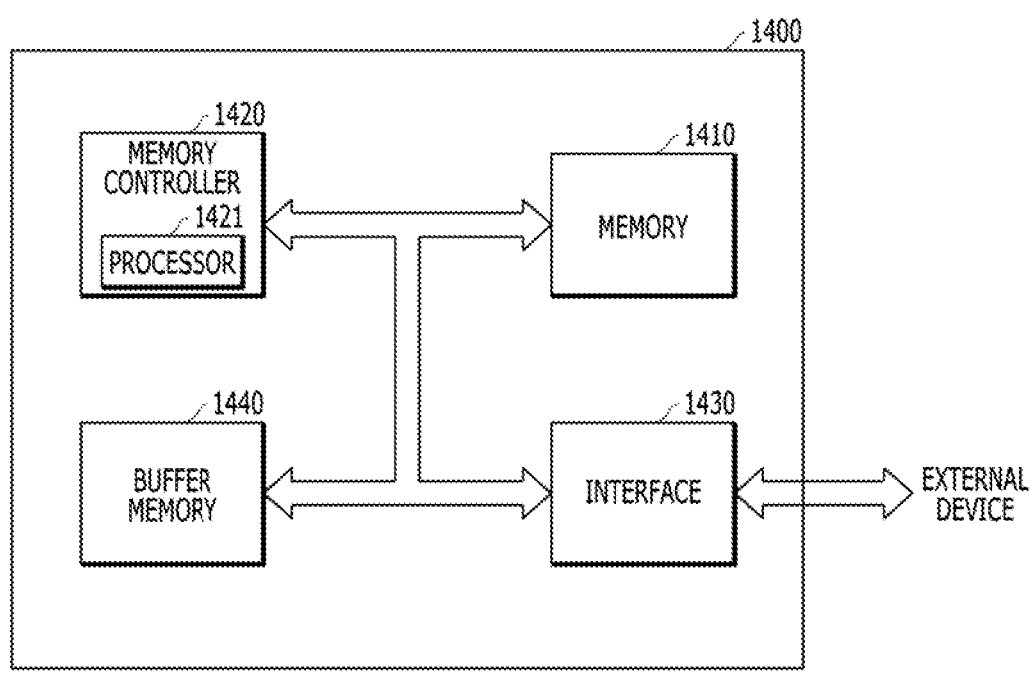
FIG. 9 is an example of a configuration diagram of a memory system implementing memory circuitry based on the disclosed technology.

FIG. 9 is an example of a configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type, such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the memory 1410 may be improved. As a consequence, performance characteristics of the memory system 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which each have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an external device outside of the memory system 1400.

The interface 1430 performs an exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include: a write circuit configured to supply a write pulse to at least one of a plurality of memory cells in a write mode, the write pulse corresponding to write data; and a write pulse conversion circuit configured to change a waveform of the write pulse, the waveform having a falling edge, the write pulse conversion circuit changing the falling edge of the wave form to have two or more slopes. Through this, characteristics of the buffer memory 1440 may be improved. As a consequence, performance characteristics of the memory system 1400 may be improved.

Moreover, the buffer memory 1440 according to the present implementation may further include any of an SRAM (static random access memory), a DRAM (dynamic random access memory), and so on, which each have a volatile characteristic; and a phase change random access memory (PRAM), a resistive random access memory (RRAM), a spin transfer torque random access memory (STTRAM), a magnetic random access memory (MRAM), and so on, which each have a nonvolatile characteristic. The buffer memory 1440 may not include the semiconductor devices according to the implementations, but may include an SRAM (static random access memory), a DRAM (dynamic random access memory), and so on, which each have a volatile characteristic; and a phase change random access memory (PRAM), a resistive random access memory (RRAM), a spin transfer torque random access memory (STTRAM), a magnetic random access memory (MRAM), and so on, which each have a nonvolatile characteristic.

Features in the above examples of electronic devices or systems in FIGS. 5-9 based on the memory devices disclosed in this document may be implemented in various devices, systems, and applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities, and so on.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in implementations described in this patent document should not be understood as requiring such separation in all implementations.

Only a few implementations and examples are described. Other implementations, enhancements and variations can be made based on what is described and illustrated in this patent document.

What is claimed is:

1. An electronic device comprising a semiconductor memory, the semiconductor memory comprising:
   a write circuit configured to supply a write pulse to at least one of a plurality of memory cells based on a set control signal and a reset control signal in a write mode, the write pulse corresponding to write data; and
   a write pulse conversion circuit configured to change a waveform of the write pulse based on only the set control signal, the waveform having a falling edge, the write pulse conversion circuit changing the falling edge of the wave form to have two or more slopes, wherein the write pulse conversion circuit includes:
: a control block configured to generate a conversion control signal based on the set control signal; and
: a conversion block configured to change the falling edge of the write pulse based on the conversion control signal,
: wherein the conversion block includes:
:: a charge unit including a first end that is coupled to a low voltage terminal; and
:: a coupling unit configured to selectively couple a second end of the charge unit to a line in response to the conversion control signal, the line transmitting the write pulse.

2. The electronic device according to claim 1, wherein a slope of a first part of the changed falling edge is steeper than a slope of a second part of the changed falling edge.

3. The electronic device according to claim 1, wherein the changed falling edge has a shape of an exponential function.

4. The electronic device according to claim 1, wherein a selected memory cell has a resistance state corresponding to the write data, the resistance state being based on the write pulse having the changed falling edge in the write mode, and
: wherein the write pulse corresponds to a set pulse having a square wave shape, the set pulse changing a resistance state of the selected memory cell into a low resistance state.

5. The electronic device according to claim 1, wherein a selected memory cell has a resistance state corresponding to the write data based on the write pulse having the changed falling edge in the write mode, and
: wherein the control block enables the conversion control signal based on the write data corresponding to a low resistance state during a period corresponding to the falling edge of the write pulse.

6. An electronic device comprising a semiconductor memory, the semiconductor memory comprising:
: a first global line;
: a second global line;
: a plurality of first local lines;
: a plurality of second local lines;
: a plurality of memory cells disposed in respective intersection regions between the plurality of first local lines and the plurality of second local lines and coupled between the plurality of first local lines and the plurality of second local lines;
: a write circuit configured to generate a write pulse corresponding to write data in a write mode;
: a first global switch circuit configured to transmit the write pulse to the first global line in response to a first global selection signal;
: a first local switch circuit configured to transmit, as a first write pulse, the write pulse transmitted to the first global line to a first local line selected from the plurality of first local lines based on a plurality of first local selection signals;
: a second local switch circuit configured to transmit a second write pulse to the second global line based on a plurality of second local selection signals, the second write pulse corresponding to the first write pulse that is transmitted through the selected first local line, a memory cell selected from the plurality of memory cells, and a second local line selected from the plurality of second local lines;
: a second global switch circuit configured to transmit the second write pulse transmitted to the second global line to a low voltage terminal in response to a second global selection signal; and
: a write pulse conversion circuit coupled to the first global line and configured to change a waveform of the write pulse transmitted to the first global line based on the first global selection signal and the write data.

7. The electronic device according to claim 6, wherein a falling edge among the waveform of the write pulse transmitted to the first global line is changed to have two or more slopes.

8. The electronic device according to claim 7, wherein a slope of a first part of the changed falling edge is steeper than a slope of a second part of the changed falling edge.

9. The method according to claim 7, wherein the changed falling edge has an exponential function shape.

10. The method according to claim 6, wherein the selected memory cell has a resistance state corresponding to the write data, which is determined by the write pulse having the changed falling edge in the write mode, and
: wherein the write pulse corresponds to a set pulse having a square wave shape, the set pulse changing the selected memory cell into a low resistance state.

11. The electronic device according to claim 6, wherein the write pulse conversion circuit includes:
: a control block configured to generate a conversion control signal by performing a logic operation on the first global selection signal based on a set control signal corresponding to a first data value of the write data; and
: a conversion block configured to change the falling edge of the write pulse based on the conversion control signal.

12. The electronic device according to claim 11, wherein a resistance state of each of the plurality of memory cells is changed into one of a low resistance state corresponding to the first data value and a high resistance state corresponding to a second data value based on the first write pulse, and
: wherein the control block enables the conversion control signal during a period corresponding to a falling edge among the waveform of the write pulse when the set control signal corresponding to the low resistance state is enabled.

13. The electronic device according to claim 11, wherein the control block includes:
: a transmission unit configured to transmit the first global selection signal in response to the set control signal;
: a delay line configured to delay the first global selection signal, which has been transmitted through the transmission unit, by a predetermined delay time; and
: an AND gate configured to generate the conversion control signal by performing an AND operation on the first global selection signal and the delayed first global selection signal.

14. The electronic device according to claim 11, wherein the conversion block includes:
: a capacitor including a first end that is coupled to a low voltage terminal; and
: a coupling unit configured to selectively couple a second end of the capacitor to the first global line in response to the conversion control signal.

15. The electronic device of claim 6, further comprising a microprocessor which includes:
: a control unit configured to receive a signal including a command from an outside of the microprocessor, and performs extracting, decoding of the command, or controlling input or output of a signal of the microprocessor;
: an operation unit configured to perform an operation based on a result that the control unit decodes the command; and a memory unit configured to store data for performing the operation, data corresponding to a result of performing the operation, or an address of data for which the operation is performed,
wherein the semiconductor memory is part of the memory unit in the microprocessor.

16. The electronic device of claim 6, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

17. The electronic device of claim 6, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

18. The electronic device of claim 6, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

19. The electronic device of claim 6, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

* * * * *